US006993141B2

(12) United States Patent
Hlibowicki

(10) Patent No.: US 6,993,141 B2
(45) Date of Patent: Jan. 31, 2006

(54) SYSTEM FOR DISTRIBUTING A SIGNAL BETWEEN LOUDSPEAKER DRIVERS

(75) Inventor: Stefan R. Hlibowicki, Toronto (CA)

(73) Assignee: Audio Products International Corp., Scarborough (CA)

( * ) Notice: Subject to any disclaimer, the term of this patent is extended or adjusted under 35 U.S.C. 154(b) by 255 days.

(21) Appl. No.: 10/231,333

(22) Filed: Aug. 30, 2002

(65) Prior Publication Data

US 2003/0063761 A1 Apr. 3, 2003

Related U.S. Application Data

(60) Provisional application No. 60/325,197, filed on Sep. 28, 2001.

(51) Int. Cl.
*H04B 3/00* (2006.01)
*H03G 5/00* (2006.01)
*H03F 21/00* (2006.01)

(52) U.S. Cl. .......................... 381/111; 381/99; 381/77; 381/120

(58) Field of Classification Search ................ 381/111, 381/99, 120, 77
See application file for complete search history.

(56) References Cited

U.S. PATENT DOCUMENTS 3,280,258 A * 10/1966 Curtis ......................... 381/27
3,637,938 A * 1/1972 Kuhlow et al. ............. 381/308
3,697,692 A * 10/1972 Hafler .......................... 381/18
4,237,340 A * 12/1980 Klipsch ....................... 381/99
5,598,480 A * 1/1997 Kim ............................ 381/99
5,982,160 A * 11/1999 Walters et al. .............. 323/282

OTHER PUBLICATIONS

A. N. Thiele, Precise Passive Crossover Networks Incorporating Loudspeaker Driver Parameters, J. Audio Eng. Soc., 1997 Jul./Aug., vol. 45, No. 7/8, Epping, NSW 2121, Australia.

Neville Thiele, Loudspeaker Crossovers with Notched Responses, J. Audio Eng. Soc., 2000 Sep., vol. 48, No. 9, Epping, NSW 2121, Australia.

David L. Smith, Discrete-Element Line Arrays—Their Modeling and Optimization, J. Audio Soc., 1997 Nov., vol. 45, No. 11, McIntosh Laboratory, Inc., Binghamton, NY 13903, USA.

* cited by examiner

*Primary Examiner*—Vivian Chin
*Assistant Examiner*—Devona E. Faulk
(74) *Attorney, Agent, or Firm*—Bereskin & Parr

(57) ABSTRACT

A system for distributing a source voltage from a signal source to a number of drivers or loudspeakers is disclosed. The system includes at least one autotransformer for connection to the signal source, and a number of drivers electrically connected to the autotransformer. The autotransformers distribute the source voltage across each of the drivers. The autotransformers produce an output voltage across each of the drivers, such that the sum of the output voltages is substantially equal to the source voltage multiplied by the number of drivers.

20 Claims, 7 Drawing Sheets

SYSTEM FOR DISTRIBUTING A SIGNAL BETWEEN LOUDSPEAKER DRIVERS

FIELD OF THE INVENTION

This invention relates to loudspeakers, and more particularly to a system for distributing a signal or voltage to loudspeaker drivers.

BACKGROUND OF THE INVENTION

It is well known to provide a loudspeaker unit which includes two or more individual speakers (also known as drivers) to cover different sections of the frequency spectrum. Loudspeakers with multiple drivers are desirable because a single driver large enough to provide adequate response at low frequencies is not capable of providing an adequate response at higher frequencies. Such systems are commonly known as two or three way systems, depending upon whether a separate driver is provided to cover two or three different frequency portions, respectively.

Moreover, in some known designs where higher efficiency is a concern, multiple drivers may be provided in each crossover section or for each frequency band. It is not uncommon to have up to three drivers or speakers in a low pass section and even two drivers in a midrange section.

A disadvantage to a loudspeaker having multiple drivers is that the drivers occupy more space, and can narrow the spatial characteristics of the system. For example, the sound from multiple speakers or drivers can appear to be more directional than from a single driver. This effect is more pronounced at higher frequencies.

One known technique for reducing this disadvantage of multiple drivers is to differentiate the signals fed to the individual drivers in one section. This is achieved by setting different low pass cutoff frequencies for each driver and this is common practice where multiple drivers are provided. The effect of this technique is to reduce the number of drivers participating in sound reproduction at higher frequencies, thereby improving sound dispersion.

However, this technique has a number of disadvantages. One of the disadvantages is lower efficiency, since at higher frequencies fewer drivers are radiating the sound. Another disadvantage is that is difficult to achieve a flat frequency response, because of a complex phase relationship between drivers connected to different low pass filters. Even if systems employing low pass filters are designed, using simple mathematical addition, to produce a flat frequency response, in practice, such systems often introduce unwanted and varying phase shifts. At higher frequencies, these phase shifts can be even more pronounced, and, result in a reduced signal level.

Accordingly, there is a need for a loudspeaker system to simply and efficiently distribute an input signal between a number of drivers. There is a further need for a system which enables different low pass cut off frequencies to be set for the drivers, while enabling a more flat, total frequency response to be provided.

SUMMARY OF THE INVENTION

The loudspeaker system according to the present invention utilizes a tapped coil or autotransformer to divide a signal between different drivers. While such autotransformers are known, they have never been used for such a purpose.

According to the present invention, a system for distributing a source voltage from a signal source is provided. The system comprises at least one autotransformer for connection to the signal source, and a plurality of drivers electrically connected to the autotransformer. The autotransformer is adapted to distribute the source voltage across each of the plurality of drivers. Preferably, the autotransformer is adapted to produce an output voltage across each of the drivers, wherein the sum of the output voltages is substantially equal to the source voltage multiplied by the number of drivers.

BRIEF DESCRIPTION OF THE DRAWINGS

For a better understanding of the present invention and to show more clearly how it may be carried into effect, reference will now be made by way of example to the accompanying drawings, which show a preferred embodiment of the present invention and in which.

DETAILED DESCRIPTION OF THE INVENTION

Figure 1:
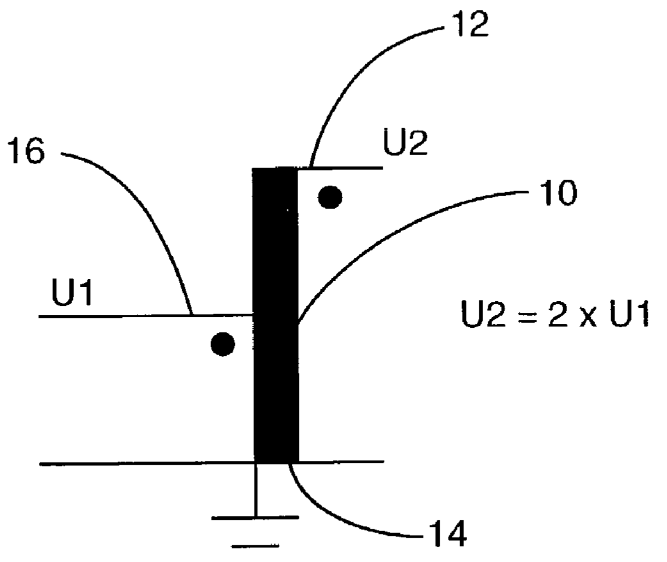
FIG. 1 is a schematic view showing the basic configuration of a center-tap autotransformer, and relationship between input and output voltages.

FIG. 1 shows a conventional autotransformer 10. As is known, the autotransformer 10 is preferably a tapped coil having end connections indicated as a first end connection 12 and a second end connection 14. The autotransformer 10 also has a tap connection 16.

Continuing to refer to FIG. 1, the tap connection 16 is connected to signal source having a source voltage u1. The second end connection 14 is connected to ground and the first connection 12 has an output voltage u2. As is known, where the tap connection 16 is in the middle of the coil (i.e. the number of windings between the tap connection 16 and first connection 12 is equal to the number of windings between the tap connection 16 and the second end connection 14), then the voltages u1 and u2 are related to the voltage of the signal source u1, as follows:

$$u2 = 2 \cdot u1 \quad (1)$$

This type of connection is known as a "center tap" connection.

Figure 2:
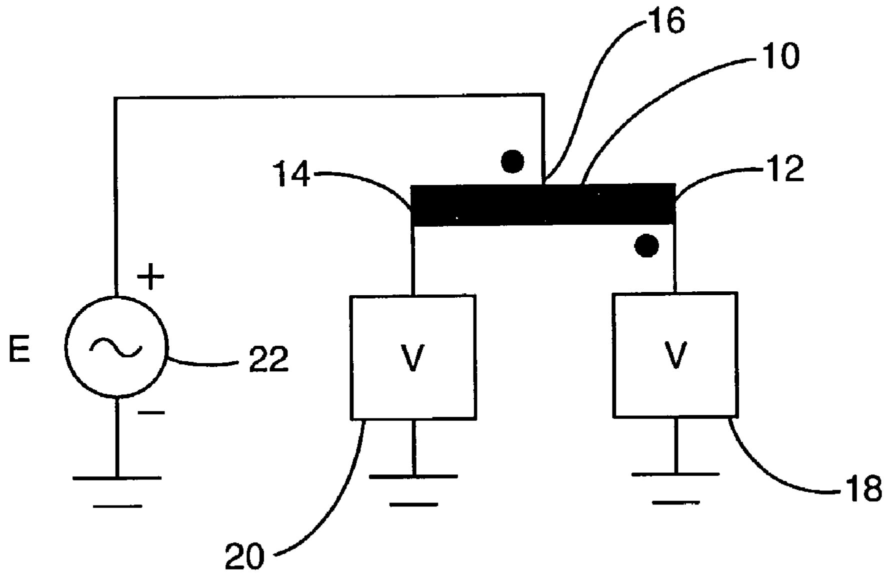
FIG. 2 is a schematic view showing an embodiment of the system according to the present invention for use with two drivers.

FIG. 2 shows one embodiment of the present invention. The autotransformer 10 is preferably identical to FIG. 1 and like parts of the autotransformer 10 have been referred to by like reference numbers. It will be understood by those skilled in the art that any other suitable autotransformer configuration may be used. Two drivers 18 and 20, are each connected to end connections 12 and 14 and ground. The drivers may be any suitable loudspeaker, such as, for example, 4 ohm drivers (as indicated by the number "4" in FIG. 3). A signal source 22 is connected between the tap connection 16 and ground, as shown. The signal source 22 generates an input signal having a source voltage E, and output voltages V1 and V2 are produced across drivers 18, 20 by the autotransformer 10. The signal source may be any conventional element capable of producing a source voltage E, such as a conventional power amplifier, a low pass filter, or the like. It will be understood by those skilled in the art that the audio signal produced by the drivers 18, 20 is proportional to the voltage across the drivers (i.e. as the voltage increases, the sound pressure produced by the drivers increases).

The inventor has discovered that the sum of the output voltages V1 and V2 remain constant, disregarding the load impedances. If the loads are identical, then each of the voltages V1, V2 are identical and equal to the source voltage E. More specifically, if the source voltage is E, then the relationship between input and output voltages is described by the following equation:

$$V1+V2=2E \tag{2}$$

This relationship between the input and output voltages remains constant, even if the loads are varied. Thus, if the impedance is varied so that one voltage, e.g., V1, decreases, the other voltage V2 increases to maintain the relationship indicated by the equation (2) above.

Figure 3:
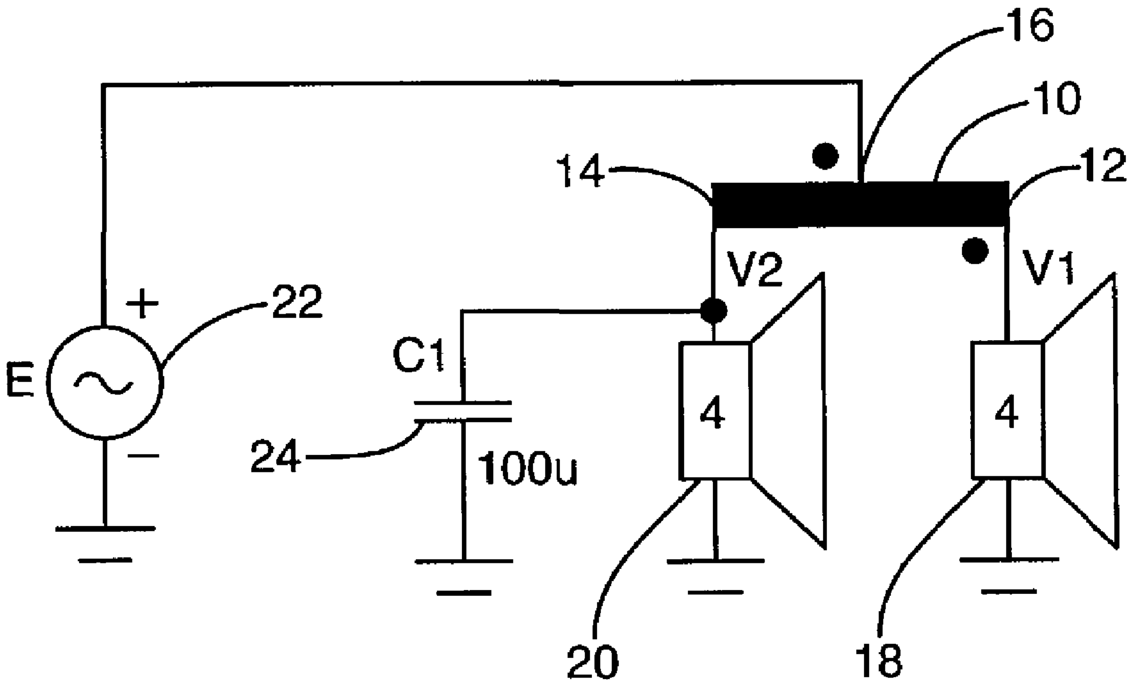
FIG. 3 is a schematic view showing another embodiment which adds a low pass filter to the embodiment of FIG. 2.

FIG. 3 shows a second embodiment of the present invention which utilizes the above relationship. This embodiment is similar to the embodiment illustrated in FIG. 2. For simplicity and brevity, like parts are given like reference numbers, and will not be described again.

Referring to FIG. 3, the output voltages supplied to the first and second drivers 18, 20 from the autotransformer 10 are indicated as V1, V2, respectively. Additionally, the second driver 20 is connected to a filter means, such as a first capacitor 24 with a value, for example, with 100 mircrofarads. The first capacitor 24 is connected to the system in parallel with the second driver 20.

The first capacitor 24 provides a cutoff frequency for the second driver 20. In effect, as the frequency increases, the combined impedance of the driver 20 and the first capacitor 24 drops, and a greater portion of the current passes through the first capacitor 24. Consequently, the output voltage across the driver 20 is reduced. In accordance with equation 2 above, the output voltage across driver 18 increases to compensate for the voltage reduction across driver 20.

As the sound level generated by each driver 18, 20 corresponds to the voltage across it, the total sound level remains the same (because the sum of the voltages is constant).

Figure 4:
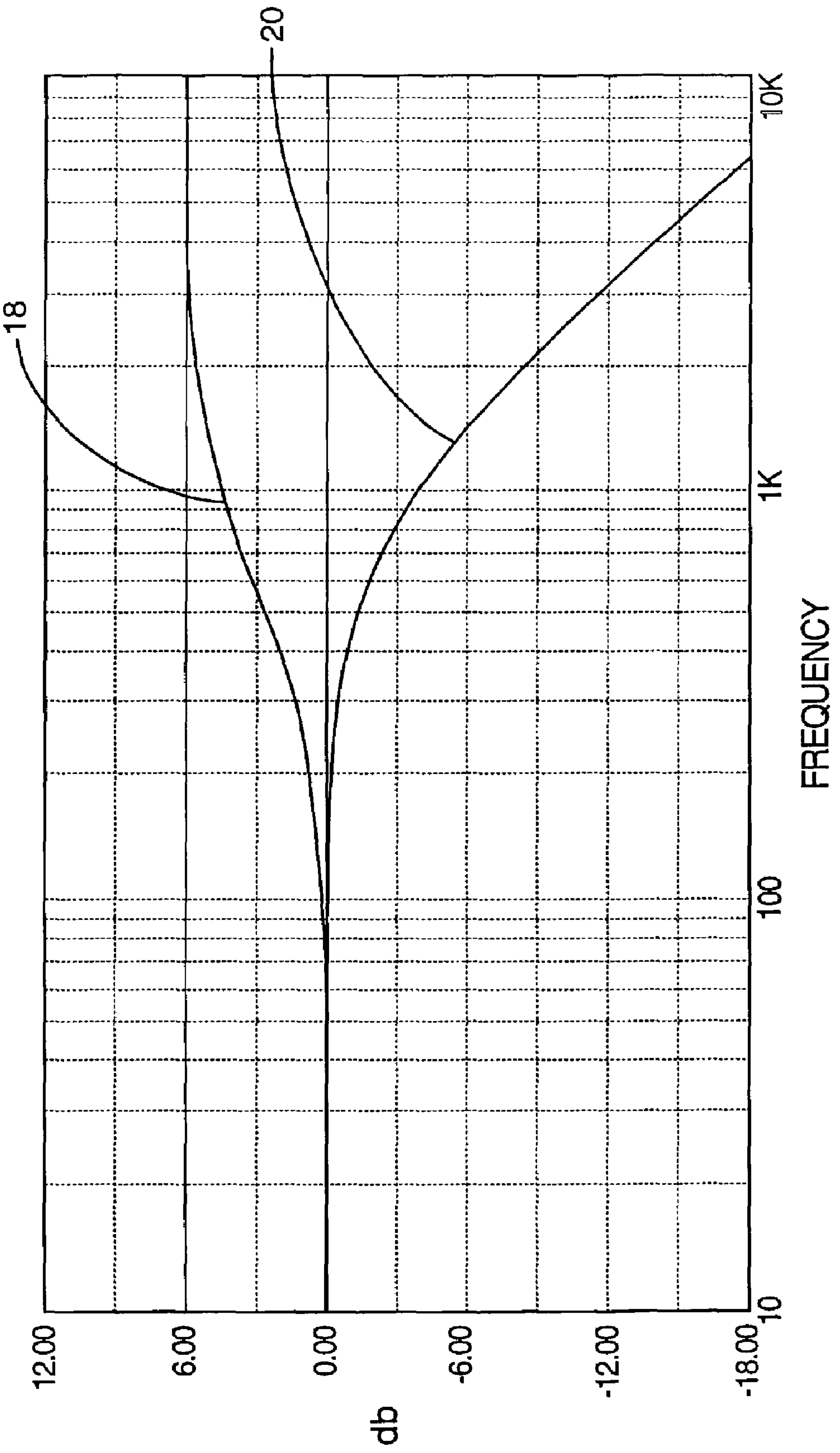
FIG. 4 is a graph showing the frequency responses of the voltages across the drivers in the embodiment of FIG. 3.

This relationship is illustrated in FIG. 4, which shows the frequency response for the embodiment of FIG. 3. The frequency response of the voltage across second driver 20 falls off at higher frequencies. Correspondingly, the frequency response of the voltage across first driver 18 increases. The sum of the voltages V1, V2 across drivers 18, 20, respectively, remains constant (also referred to as flat) and is represented by the straight line at +6 dB (6=20×log (2)). This result also demonstrates that the total efficiency of the system, as a function of frequency, remains the same.

Figure 5:
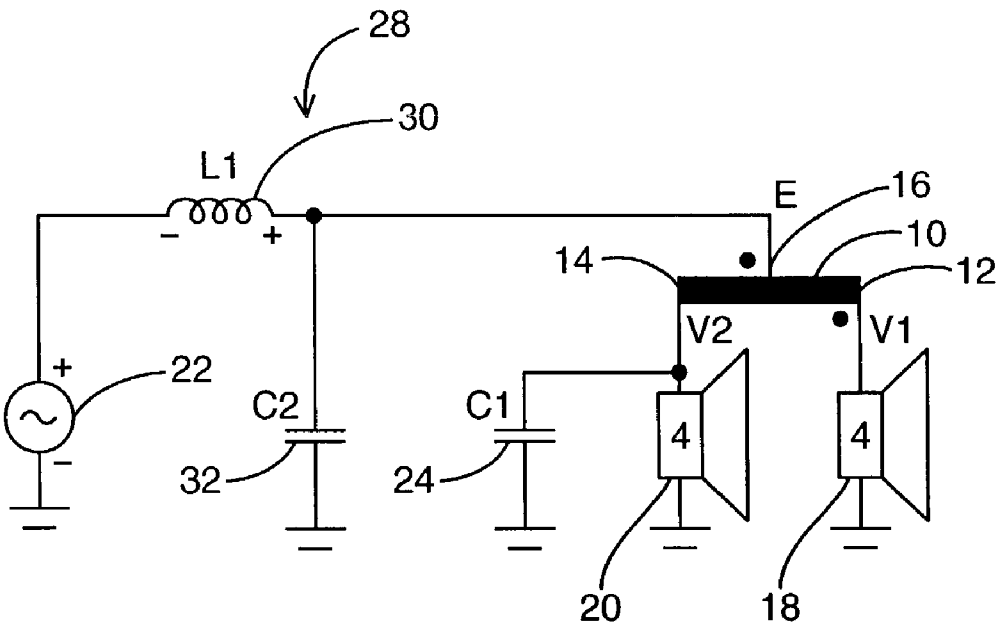
FIG. 5 is a schematic view showing another embodiment which adds another low pass filter to the embodiment of FIG. 3.

FIG. 5 shows another embodiment of the system according to the present invention. Again, parts common with the embodiment of FIG. 3 are assigned like reference numbers and will not be further described.

Referring to FIG. 5, a filter means such, as a low pass filter, generally indicated at 28 is provided between the signal source 22 and the autotransformer 10. It will be understood by those skilled in the art that the filter means may be any other type of filter, such as a band pass filter, high pass filter, all pass filter, or a combination thereof. Each of these filters may comprise one or more coils, capacitors, resistors, or transformers, or a combination thereof.

The low pass filter 28 may be any known low pass filter, such as, an inductor 30 and a second capacitor 32 having values selected to give a desired low cut off frequency. For example, for a desired cut-off frequency of 2 kHz, the inductor 30 would have a value of 0.5 mH and second capacitor 32 would have a value of 12.6 uF. This embodiment is particularly suited for driving a pair of drivers 18, 20 which are low frequency speakers or woofers. Thus, at a desired cutoff frequency the low pass filter 28 cuts off or reduces the output voltage across the drivers 18, 20. Otherwise, the operation of this embodiment is similar to that described for FIG. 3 above.

It is to be noted that while the low pass filter 28 is located before the autotransformer 10 in FIG. 5, the low pass filter 28 may instead be replaced by individual low pass filters for each driver 18, 20, after the autotransformer 10. Such a configuration would advantageously influence the overall system impedance, which in turn, reduces the likelihood of overloading the amplifier.

While the first capacitor 24 shown in FIG. 5 provides the cutoff frequency for the driver 20, it will be understood by those skilled in the art that various other elements may be included. For example, any suitable combination of resistors, inductors, and capacitors may be provided to achieve the desired frequency characteristics.

Figure 6:
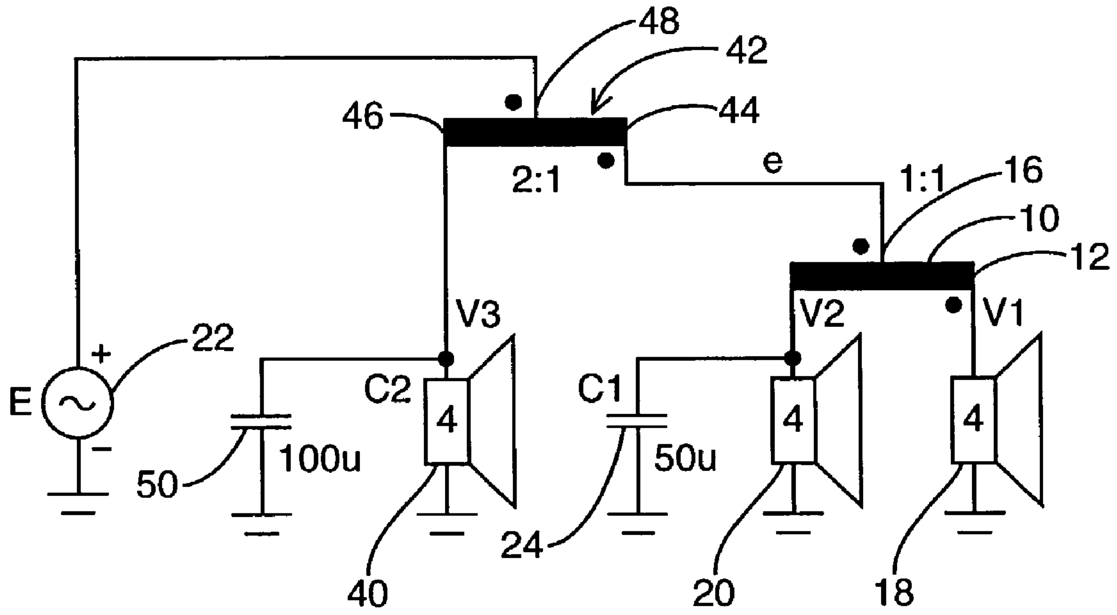
FIG. 6 is a schematic view showing yet another embodiment for use with three drivers.

FIG. 6 shows yet another embodiment of the loudspeaker system according to the present invention. This embodiment provides a further development of the embodiments previously described, and accordingly like components are assigned like reference numbers and their description is not repeated.

Referring to FIG. 6, a third driver 40 is added to the system. To distribute the source voltage E from the signal source 22 accordingly, a second autotransformer 42 with end connections 44 and 46 is provided. The third driver 40 is connected to end connection 46 and the tap connection 16 of the first autotransformer 10 is connected to end connection 44 to receive an input voltage therefrom. The signal source 22 is now connected to a tap connection 48 of the second transformer 44. This tap connection 48 is positioned such that the number of turns of the winding between tap connection 48 and each of the end connections 46, 44 is in a ratio of 2:1, respectively (i.e., the number of turns between the connections 46, 48 is the twice the number of turns between the connections 44, 48).

Continuing to refer to FIG. 6, output voltages V1, V2, and V3 are produced across drivers 18, 20, and 40. The relationships between these voltages and the source voltage E is described by the equation:

$$V1+V2+V3=3E \tag{3}$$

As before, the second driver 20 is provided with a first capacitor 24, with a value of for example 50 microfarads, to give a low cutoff frequency. A second capacitor 50 is connected to the third driver 40. The second capacitor may be configured for any suitable cutoff frequency, such as, for example 100 mircrofarads to give an even lower cutoff frequency.

Figure 7:
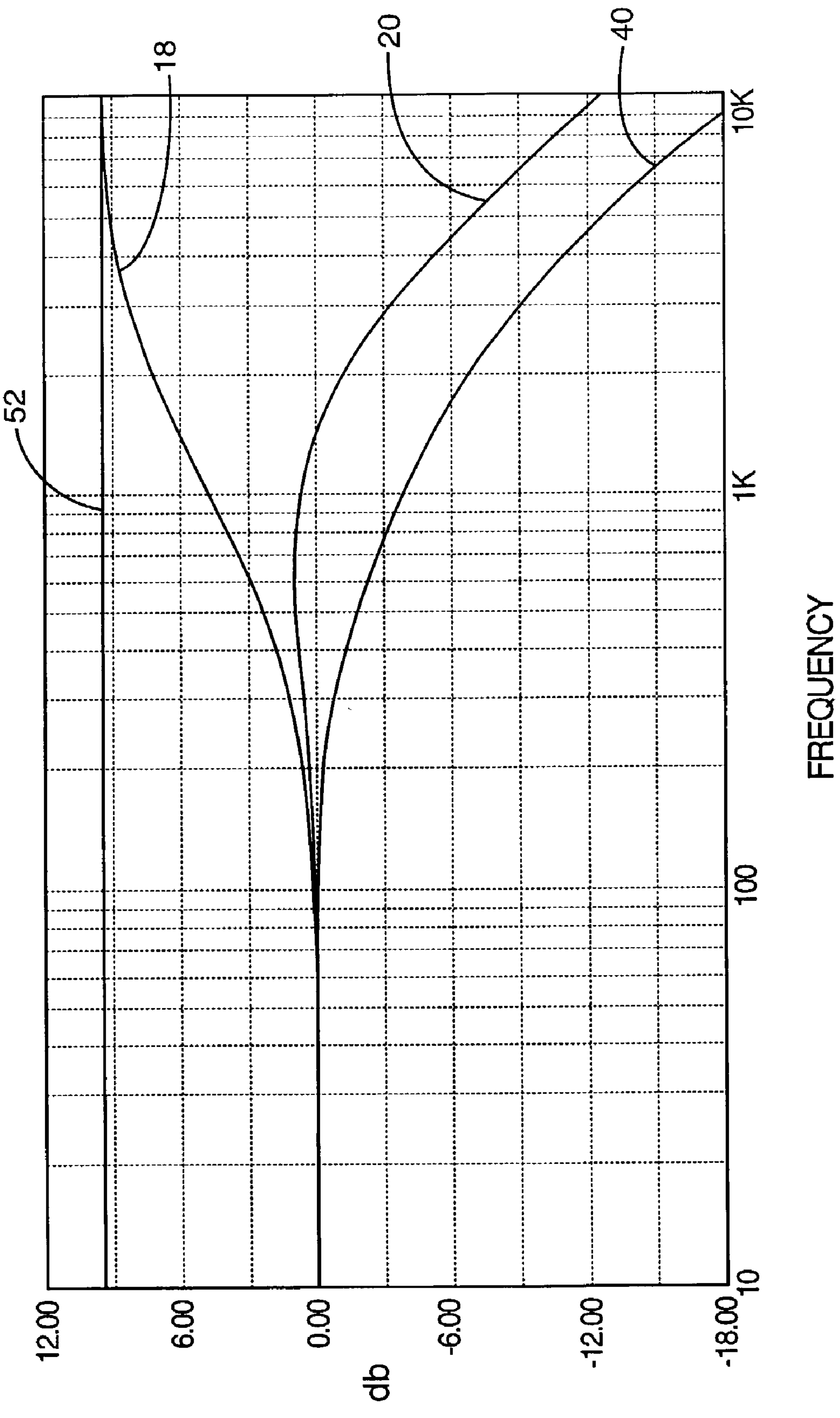
FIG. 7 is a graph showing the frequency response of the embodiment FIG. 6.

The frequency response of this embodiment is illustrated in FIG. 7, where the voltages of the three drivers are indicated by the reference numerals 18, 20, and 40. The horizontal line 52 illustrates the flat frequency response of the sum of the voltages across each of the three drivers (measured in dBs) in accordance with equation (3) above. The third driver 40 has a relatively low cutoff frequency, as shown. The second driver 20 has a slightly higher cutoff frequency. At high frequencies, the signal illustrated by line 52 is made up of voltage V1 across the first driver 18. FIG. 7 shows line 52 having a total signal level of 9.54 dB (9.54=20×log(3)).

Figure 8:
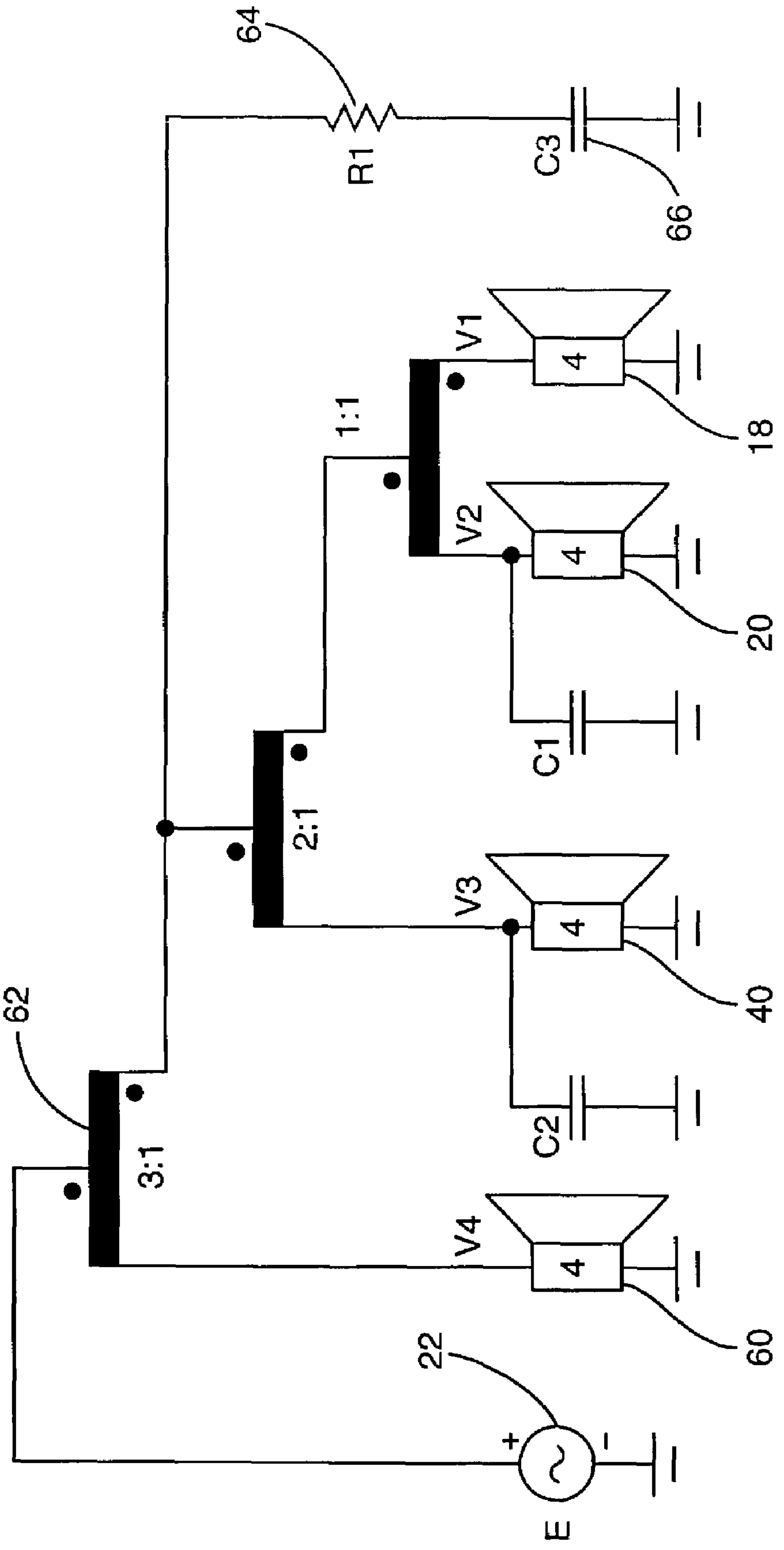
FIG. 8 is a schematic view showing yet another embodiment of the present invention for use with four drivers.

Yet another embodiment of the present invention is shown in FIG. 8. This embodiment includes the three drivers 18, 20, 40 and first and second autotransformers 10, 42 of FIG. 6. A fourth driver 60 is connected to a third autotransformer 62. The third autotransformer 62 has a turn ratio of 3:1 and is connected between the signal source 22 and second autotransformer 42. A combination of resistor 64 and third capacitor 66 connected in parallel to the system as shown provide a low pass filter for drivers 18, 20, and 40. In this embodiment, driver 60 has the widest frequency range. In the manner shown in FIG. 8, any driver can be selected as the driver with the widest frequency range. As discussed above, this configuration does not alter the relationship described by the following equation:

$$V1+V2+V3+V4=4E \quad (4)$$

Figure 9:
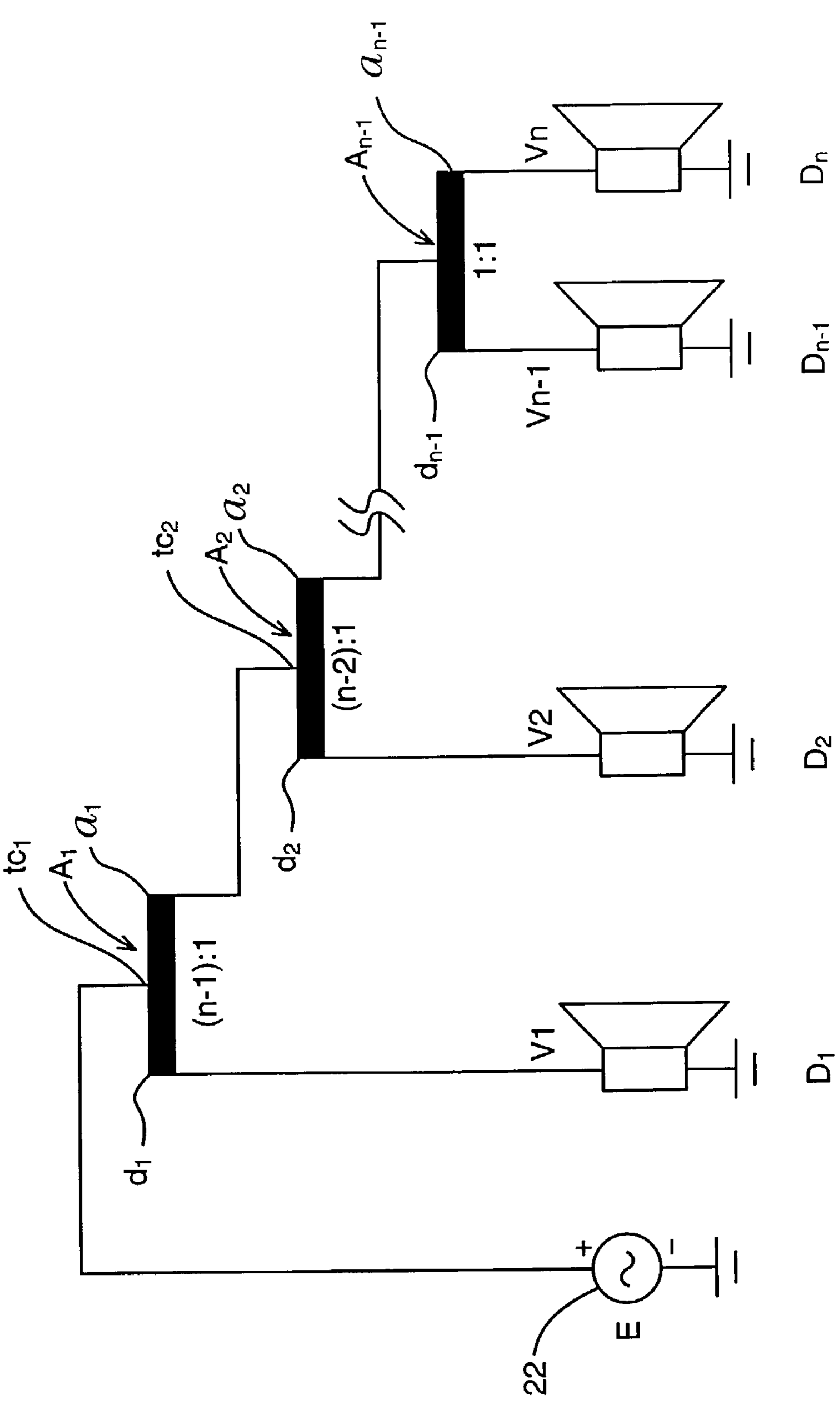
FIG. 9 is a schematic view illustrating the relationship between the various elements in the loudspeaker system according to the present invention.

It will be understood by those skilled in the art that the relationship described by equations (2), (3), and (4) above and the system according to the present invention may be extended to any number of drivers. FIG. 9 illustrates this relationship. Any suitable number of drivers, $D_1$–$D_n$ may be provided. Source voltage E from signal source 22 is distributed to drivers $D_1$–$D_n$ by autotransformers $A_1$–$A_{n-1}$. As illustrated, the number of autotransformers is preferably one less than the number of drivers. The autotransformers $A_1$–$A_{n-1}$ produce output voltages $V_1$–$V_n$ across each of the drivers $D_1$–$D_n$, respectively. The relationship is described by the following equation:

$$V_1+V_2+V_3+\ldots V_n=nE \quad (4)$$

where n is the total number of drivers connected to signal source 22.

Continuing to refer to FIG. 9, the first end connection and second end connection of each autotransformer are referred to in this FIG. 9 as a and d, respectively. The end connection d of each autotransformer A is connected to the corresponding driver D, and the end connection a is connected to the adjacent autotransformer (except end connection $a_{n-1}$ which is connected to driver $D_n$). The winding ratio between: (i) the tap connection tc to d; and (ii) tap connection tc to a of a particular autotransformer $A_x$ is: (n−x):1, where n is the number of drivers and x is the position of the autotransformer (such that x=1 for the autotransformer $A_1$ connected directly to the signal source 22, x=2 for the autotransformer $A_2$ connected to $A_1$, and so on).

Various elements and networks may be added to the system shown in FIG. 9 to adjust the responses of individual or groups of drivers, as shown in FIGS. 5, 6, and 8. Some examples of the elements and networks are capacitors, resistors, and inductors in various combinations, as illustrated in FIGS. 5, 6, and 8. These elements and networks may be connected in parallel to the system without affecting the relationship described in Equation 4. If such elements or networks are connected in series with one or more of the drivers, such configurations would disrupt the relationship described by equation 4. However, certain configurations may provide other advantages for the system and only have a small impact on the relationship described in equation 4, such that the advantages would outweigh the impact. It will be understood by those skilled in the art that such variations are within the scope of the present invention.

The loudspeaker system according to the present invention utilizes one or more autotransformers, such as a tap coil, to distribute the input signal received by a number drivers. The use of one or more autotransformers to distribute the input signal or voltage provides the advantage of a more flat frequency response from the drivers. Specifically, the sum of the voltages across each driver is constant, regardless whether one or all of the drivers are producing sound. This sum is equal to the source voltage multiplied by the number of drivers. The present invention is particularly useful for loudspeaker systems which are designed such that only a portion of the drivers produce an acoustic signal in a particular frequency range, such as at high frequencies. In such systems, the voltages across the drivers in use increase to preserve the acoustic level of the system.

While the above description constitutes the preferred embodiments, it will be appreciated that the present invention may be embodied in other specific forms without departing from the spirit or essential characteristics thereof.

What is claimed is:

1. A system for distributing a source voltage from a signal source, the system comprising:

a) at least one autotransformer comprising:
  i) a tap connection adapted for electrical connection to said signal source;
  ii) a first end connection;
  iii) a second end connection, wherein said tap connection is located between said first end connection and said second end connection; and
b) a plurality of drivers electrically connected to said at least one autotransformer;

wherein said first end connection is electrically connected to a first one of said plurality of drivers and said second end connection is electrically connected to a second one of said plurality of drivers or a second of said at least one autotransformer, wherein said at least one autotransformer is adapted to distribute said source voltage across each of said plurality of drivers;

wherein the turn ratio of said at least one autotransformer is (n−x):1, where n is the number of said plurality of drivers and x is the position of said at least one autotransformer from said signal source.

2. The system of claim 1, wherein said at least one autotransformer is adapted to produce an output voltage across each of said plurality of drivers, each of said plurality of drivers being adapted to convert said corresponding output voltage to an acoustic signal, wherein the sum of said output voltages is substantially equal to said source voltage multiplied by the number of said plurality of drivers.

3. The system of claim 2, wherein said at least one autotransformer comprises a plurality of autotransformers, wherein the number of said plurality of autotransformers is one less than the number of said plurality of drivers.

4. The system of claim 3, wherein said first end connection of each of said plurality of autotransformers is electrically connected to a corresponding one of said plurality of drivers, said second end connection of a distally positioned one of said plurality of autotransformers being electrically connected to one of said plurality of drivers, said second end connection of a remaining portion of said plurality of autotransformers being connected to the tap connection of an adjacently positioned one of said plurality of autotransformers.

5. The system of claim 4, wherein the turn ratio of each of said plurality of autotransformers is (n−x):1, where n is the number of said plurality of drivers and x is the position of a selected one of said plurality of autotransformers form said signal source.

6. The system of claim 5, wherein said plurality of autotransformers comprises a first and second autotransformer and said plurality of drivers comprises a first, second, and third driver, wherein said first end connection of said first autotransformer is electrically connected to said first driver and said second end connection of said first autotransformer is electrically connected to said second driver, wherein said first end connection of said second autotransformer is electrically connected to said third driver and said second end connection of said second autotransformer is electrically connected to said tap connection of said first autotransformer, wherein said tap connection of said second autotransformer is electrically connected to said signal source, said first auto-transformer having a turn ratio of 1:1, said second autotransformer having a turn ratio of 2:1.

7. The system of claim 6, further comprising a first and second low pass filter, said first low pass filter being electrically connected between said first autotransformer and said second driver, said second low pass filter being electrically connected between said second autotransformer and said third driver, each of said first and second low pass filters being adapted to reduce said corresponding output voltage at different cutoff frequencies.

8. The system of claim 2, further comprising at least one first filter means for reducing said output voltage at a predetermined frequency, said at least one filter means being electrically connected to at least one of said plurality of drivers.

9. The system of claim 8, wherein said filter means is connected in parallel to said at least one of said plurality of drivers.

10. The system of claim 9, wherein said at least one filter means comprises a low pass filter.

11. The system of claim 10, wherein said low pass filter comprises a capacitor electrically connected said at least one driver.

12. The system of claim 11, wherein said low pass filter further comprises an inductor in combination with said capacitor.

13. The system of claim 11, wherein said low pass filter comprises a resistor in combination with said capacitor.

14. The system of claim 9, further comprising a plurality of low pass filters, each of said plurality of low pass filters being electrically connected to a corresponding one of at least a portion of said plurality of drivers.

15. The system of claim 14, wherein at least a portion of said plurality of low pass filters have different cutoff frequencies.

16. A system for distributing a source voltage from a signal source, the system comprising:

a) at least one autotransformer comprising:
   i) a first end connection adapted to produce a first output voltage;
   ii) a second end connection adapted to produce a second output voltage; and
   iii) a tap connection adapted for electrical connection to said signal source, wherein said tap connection is located between said first end connection and said second end connection;

b) a first driver electrically connected to said first end connection, wherein said first output voltage is received by said first driver solely from said first end connection; and c) a second driver electrically connected to said second end connection, wherein said second output voltage is received by said second driver solely from said second end connection;

wherein the turn ratio of said at least one autotransformer is (n−x):1, where n is the number of said plurality of drivers and x is the position of said at least one autotransformer from said signal source.

17. The system of claim 16, further comprising a plurality of autotransformers and a plurality of drivers, wherein said plurality of autotransformers are adapted to produce an output voltage across each of said plurality of drivers, wherein the sum of said output voltages is equal to said source voltage multiplied by the number of said plurality of drivers.

18. The system of claim 17, wherein said plurality of autotransformers comprises said first autotransformer and a remaining portion of said plurality of autotransformers, wherein said first end connection of each of said remaining portion of said plurality of autotransformers is electrically connected to a corresponding one of said plurality of drivers, wherein said second end connection of said remaining portion of said plurality of autotransformers is electrically connected to said tap connection of an adjacently positioned one of said plurality of autotransformers.

19. The system of claim 18, wherein the turn ratio of each of said plurality of autotransformers is (n−x):1, where n is the number of said plurality of drivers and x is the position of a selected one of said plurality of autotransformers form said signal source.

20. The system of claim 19, wherein said plurality of autotransformers comprises said first autotransformer and a second autotransformer, wherein said plurality of drivers comprises said first driver, said second driver, and a third driver, wherein said first end connection of said second autotransformer is electrically connected to said third driver and said second end connection of said second autotransformer is electrically connected to said tap connection of said first autotransformer, wherein said tap connection of said second autotransformer is electrically connected to said signal source, wherein said first autotransformer has a turn ratio of 1:1 and said second autotransformer has a turn ratio of 2:1.

* * * * *